United States Patent
Lin et al.

(10) Patent No.: US 9,633,941 B2
(45) Date of Patent: Apr. 25, 2017

(54) SEMICONDUCTOR DEVICE STRUCTURE AND METHOD FOR FORMING THE SAME

(71) Applicant: TAIWAN SEMICONDUCTOR MANUFACTURING CO., LTD., Hsin-Chu (TW)

(72) Inventors: Shu-Cheng Lin, Hsinchu County (TW); Chih-Lin Wang, Zhubei (TW); Kang-Min Kuo, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/832,655

(22) Filed: Aug. 21, 2015

(65) Prior Publication Data

US 2017/0053868 A1    Feb. 23, 2017

(51) Int. Cl.

| | |
|---|---|
| H01L 23/48 | (2006.01) |
| H01L 23/52 | (2006.01) |
| H01L 29/40 | (2006.01) |
| H01L 23/522 | (2006.01) |
| H01L 23/528 | (2006.01) |
| H01L 21/768 | (2006.01) |
| H01L 23/532 | (2006.01) |
| H01L 21/311 | (2006.01) |
| H01L 21/02 | (2006.01) |

(52) U.S. Cl.
CPC ...... *H01L 23/5226* (2013.01); *H01L 21/0223* (2013.01); *H01L 21/02063* (2013.01); *H01L 21/02274* (2013.01); *H01L 21/31116* (2013.01); *H01L 21/76802* (2013.01); *H01L 21/76831* (2013.01); *H01L 21/76877* (2013.01); *H01L 23/528* (2013.01); *H01L 23/5329* (2013.01); *H01L 21/02252* (2013.01)

(58) Field of Classification Search
CPC .......................... H01L 23/5226; H01L 23/528
USPC ......................................................... 257/774
See application file for complete search history.

(56) References Cited

U.S. PATENT DOCUMENTS

| | | | | |
|---|---|---|---|---|
| 6,114,259 | A * | 9/2000 | Sukharev | H01L 21/02126 257/E21.256 |
| 6,429,118 | B1 * | 8/2002 | Chen | H01L 21/2855 257/E21.169 |
| 6,753,249 | B1 * | 6/2004 | Chen | H01L 21/7684 257/E21.583 |
| 8,623,760 | B2 | 1/2014 | Shih et al. | |

(Continued)

*Primary Examiner* — David S Blum
(74) *Attorney, Agent, or Firm* — Birch, Stewart, Kolasch & Birch, LLP

(57) ABSTRACT

A semiconductor device structure is provided. The semiconductor device structure includes a substrate. The semiconductor device structure includes a first conductive structure over the substrate. The semiconductor device structure includes a first dielectric layer over the substrate. The first dielectric layer has a first opening exposing the first conductive structure. The semiconductor device structure includes a seal layer covering an inner wall of the first opening and in direct contact with the first dielectric layer. The seal layer includes a dielectric material including an oxygen compound. The semiconductor device structure includes a second conductive structure filled in the first opening and surrounded by the seal layer. The second conductive structure is electrically connected to the first conductive structure.

20 Claims, 15 Drawing Sheets

(56) References Cited

U.S. PATENT DOCUMENTS

| | | | |
|---|---|---|---|
| 2001/0045651 A1* | 11/2001 | Saito | H01L 21/28518 257/750 |
| 2007/0042600 A1* | 2/2007 | Takeoka | H01L 21/768 438/638 |
| 2014/0264709 A1* | 9/2014 | Tsai | H01L 23/481 257/459 |
| 2014/0264872 A1 | 9/2014 | Lin et al. | |

* cited by examiner

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
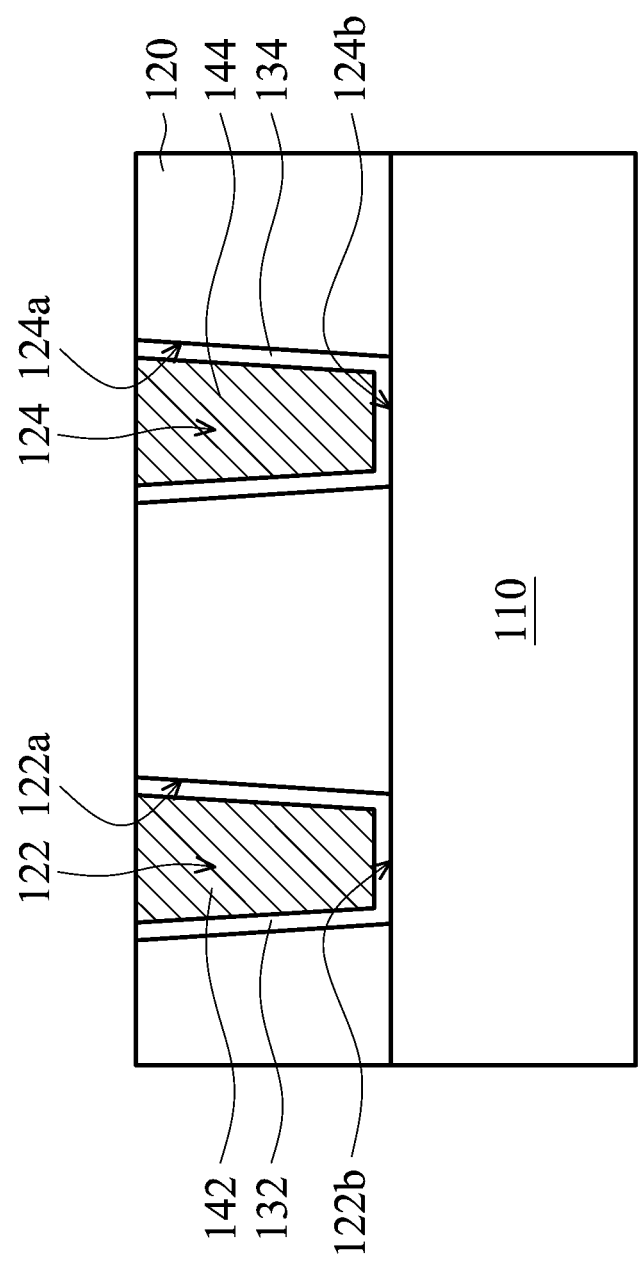
FIGS. 1A-1F are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1F are cross-sectional views of various stages of a process for forming a semiconductor device structure, in accordance with some embodiments. As shown in FIG. 1A, a substrate 110 is provided, in accordance with some embodiments. The substrate 110 includes a semiconductor wafer (such as a silicon wafer) or a portion of a semiconductor wafer (such as a chip), in accordance with some embodiments.

In some embodiments, the substrate 110 is made of an elementary semiconductor material including silicon or germanium in a single crystal, polycrystal, or amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or combinations thereof. The substrate 110 may also include multi-layer semiconductors, semiconductor on insulator (SOI) (such as silicon on insulator or germanium on insulator), or combinations thereof.

As shown in FIG. 1A, a dielectric layer 120 is formed over the substrate 110, in accordance with some embodiments. The dielectric layer 120 has recesses 122 and 124 exposing a portion of the substrate 110, in accordance with some embodiments. The dielectric layer 120 includes, but is not limited to, oxide, $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS).

The dielectric layer 120 may include multilayers made of multiple dielectric materials, such as a low dielectric constant or an extreme low dielectric constant (ELK) material. The dielectric layer 120 may be formed by chemical vapor deposition (CVD), physical vapor deposition (PVD), atomic layer deposition (ALD), spin-on coating, or another applicable process. The dielectric layer 120 is patterned using a photolithography process and an etching process, in accordance with some embodiments.

As shown in FIG. 1A, a barrier layer 132 is formed in the recess 122 to cover an inner wall 122a and a bottom surface 122b of the recess 122, in accordance with some embodiments. As shown in FIG. 1A, a barrier layer 134 is formed in the recess 124 to cover an inner wall 124a and a bottom surface 124b of the recess 124, in accordance with some embodiments. The barrier layers 132 and 134 are configured to prevent diffusion of metal materials formed in the recesses 122 and 124 into the dielectric layer 120, in accordance with some embodiments.

The barrier layers 132 and 134 include tantalum (Ta) and tantalum nitride (TaN), in accordance with some embodiments. The barrier layers 132 and 134 are formed using a physical vapor deposition (PVD) process, a chemical vapor deposition (CVD) process, or another suitable process.

As shown in FIG. 1A, conductive structures 142 and 144 are formed in the recesses 122 and 124, respectively, in accordance with some embodiments. The conductive structure 142 or 144 includes a conductive line, a conductive via, or another suitable interconnection structure, in accordance with some embodiments.

The conductive structures 142 and 144 are filled in the recesses 122 and 124, respectively, in accordance with some embodiments. The conductive structures 142 and 144 include copper (Cu), tungsten (W), aluminum (Al), or another suitable material. The conductive structures 142 and 144 are formed using a physical vapor deposition process, a plating process, or another suitable process.

Figure 1B:
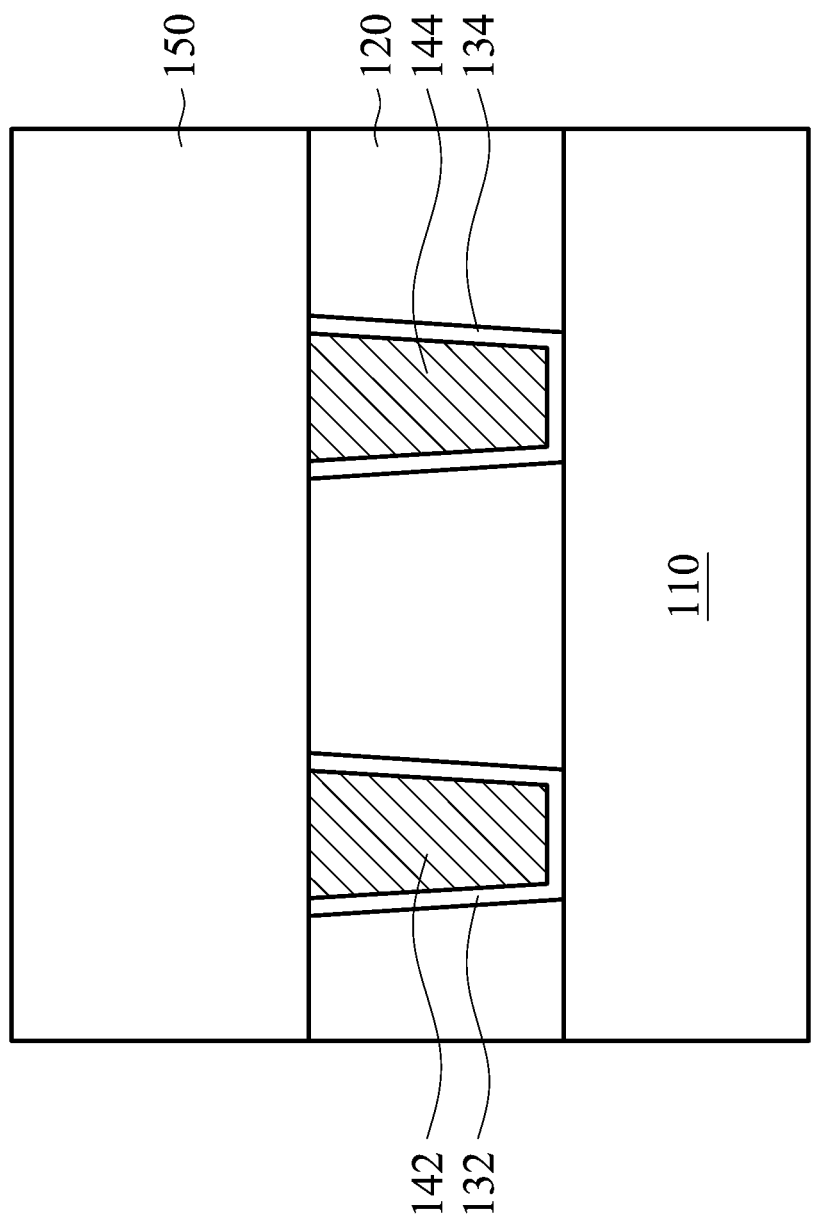

As shown in FIG. 1B, a dielectric layer 150 is formed over the dielectric layer 120 and the conductive structures 142 and 144, in accordance with some embodiments. The dielectric layer 150 includes, but is not limited to, oxide, $SiO_2$, borophosphosilicate glass (BPSG), spin on glass (SOG), undoped silicate glass (USG), fluorinated silicate glass (FSG), high-density plasma (HDP) oxide, or plasma-enhanced TEOS (PETEOS).

The dielectric layer 150 may include multilayers made of multiple dielectric materials, such as a low dielectric constant or an extreme low dielectric constant (ELK) material. The dielectric layer 150 may be formed by chemical vapor deposition (CVD), physical vapor deposition (PVD), atomic layer deposition (ALD), spin-on coating, or another applicable process.

Figure 1C:
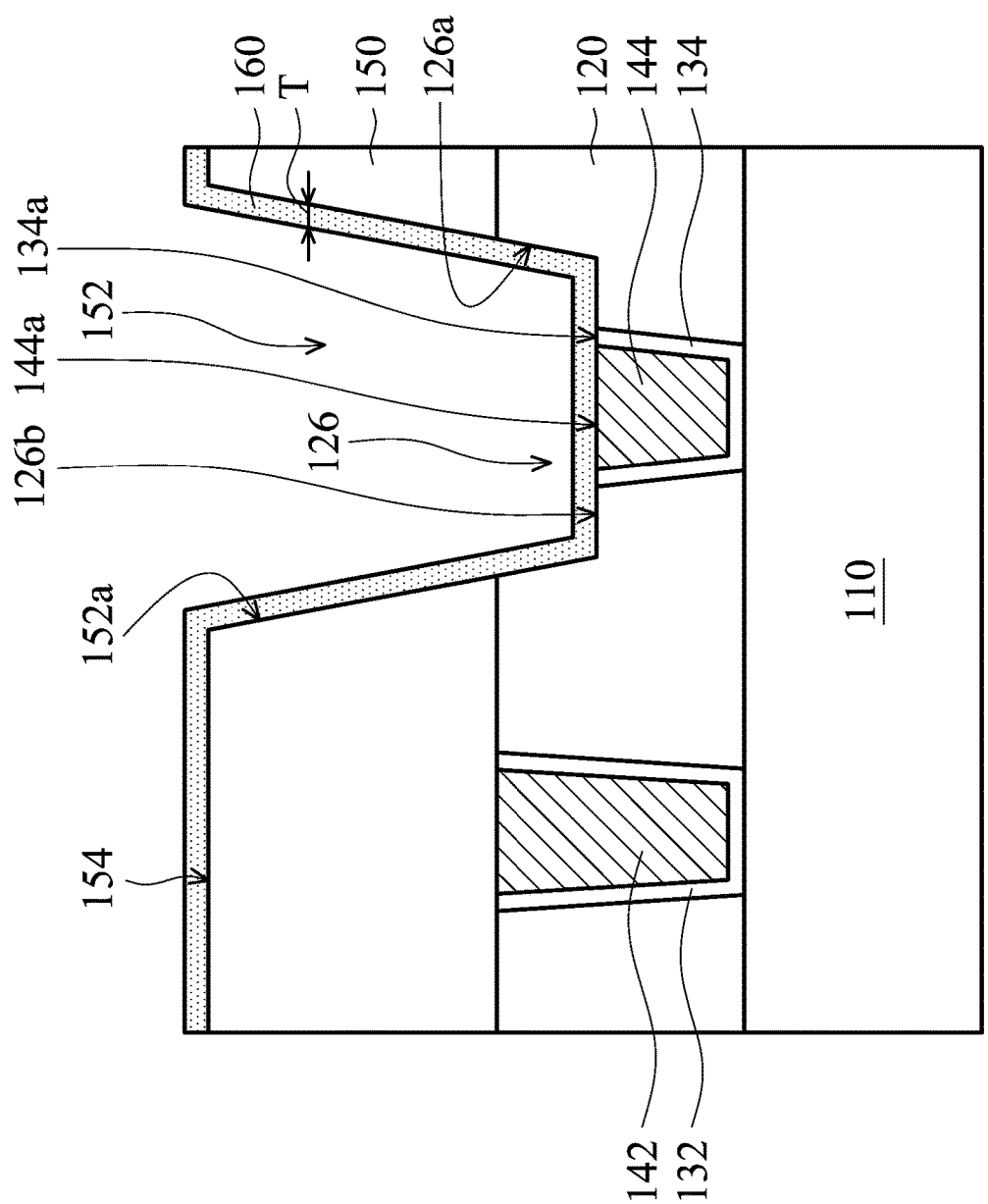

As shown in FIG. 1C, a plasma etching and deposition process is performed on the dielectric layers 120 and 150 to remove portions of the dielectric layers 120 and 150 and to form a seal layer 160 over the dielectric layers 120 and 150 and the conductive structure 144, in accordance with some embodiments.

After the plasma etching and deposition process, an opening 152 and a recess 126 are formed in the dielectric layers 150 and 120, respectively, in accordance with some embodiments. The opening 152 passes through the dielectric layer 150, in accordance with some embodiments. The opening 152 and the recess 126 expose the conductive structure 144, the barrier layer 134, and the dielectric layer 120 adjacent to the conductive structure 144, in accordance with some embodiments. The plasma etching and deposition process further removes portions of the conductive structure 144 and the barrier layer 134, in accordance with some embodiments.

The seal layer 160 covers an inner wall 152a of the opening 152, an inner wall 126a and a bottom surface 126b of the recess 126, a top surface 144a of the conductive structure 144, a top surface 134a of the barrier layer 134, and a top surface 154 of the dielectric layer 150, in accordance with some embodiments. The seal layer 160 conformally covers the inner wall 152a of the opening 152, the inner wall 126a and the bottom surface 126b of the recess 126, the top surface 144a of the conductive structure 144, the top surface 134a of the barrier layer 134, and the top surface 154 of the dielectric layer 150, in accordance with some embodiments.

The seal layer 160 covers the entire inner wall 152a of the opening 152, the entire inner wall 126a and the entire bottom surface 126b of the recess 126, the entire top surface 144a of the conductive structure 144, the entire top surface 134a of the barrier layer 134, and the entire top surface 154 of the dielectric layer 150, in accordance with some embodiments.

The seal layer 160 continuously covers the entire inner wall 152a of the opening 152, the entire inner wall 126a and the entire bottom surface 126b of the recess 126, the entire top surface 144a of the conductive structure 144, the entire top surface 134a of the barrier layer 134, and the entire top surface 154 of the dielectric layer 150, in accordance with some embodiments. The seal layer 160 is a continuous layer, in accordance with some embodiments. The seal layer 160 is in direct contact with the dielectric layers 120 and 150, the conductive structure 144, and the barrier layer 134, in accordance with some embodiments.

The seal layer 160 has a thickness T ranging from about 0.1 Å to about 10 Å, in accordance with some embodiments. If the thickness T is less than 0.1 Å, it is hard to form the continuous seal layer 160, in accordance with some embodiments. If the thickness T is greater than 10 Å, it is hard to pattern the seal layer 160, in accordance with some embodiments.

The seal layer 160 includes a dielectric material including an oxygen compound, in accordance with some embodiments. The oxygen compound includes silicon dioxide or another suitable material, in accordance with some embodiments. The plasma etching and deposition process uses a process gas, in accordance with some embodiments. The process gas includes an etching gas and a deposition gas, in accordance with some embodiments.

The etching gas is configured to remove the dielectric layers 150 and 120, in accordance with some embodiments. The etching gas includes $NF_3$, $CF_4$, or another suitable etching gas. The deposition gas is configured to deposit the seal layer 160, in accordance with some embodiments. The deposition gas includes oxygen, in accordance with some embodiments. The deposition gas includes $O_2$, CO, or $CO_2$, in accordance with some embodiments. The deposition gas includes silane or another suitable material, in accordance with some embodiments.

During the plasma etching and deposition process, the seal layer 160 is formed to cover the dielectric layers 120 and 150, the conductive structure 144, and the barrier layer 134, therefore the seal layer 160 prevents by-products (e.g., polymers) from being formed on the dielectric layers 120 and 150, the conductive structure 144, and the barrier layer 134, in accordance with some embodiments. As a result, the seal layer 160 prevents contamination of the dielectric layers 120 and 150, the conductive structure 144, and the barrier layer 134, in accordance with some embodiments. The seal layer 160 improves the yield of the process, in accordance with some embodiments.

Figure 1D:
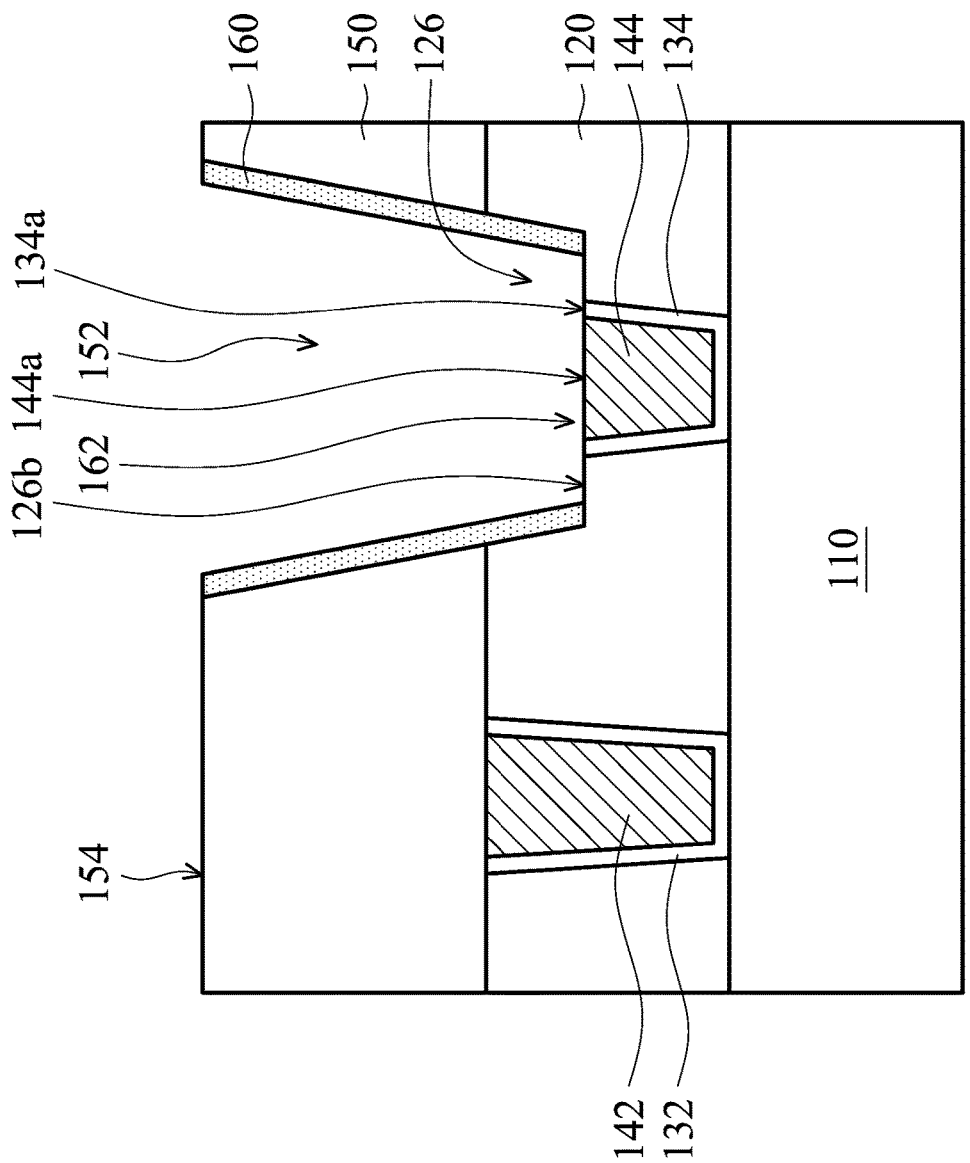

As shown in FIG. 1D, the seal layer 160 over the top surface 154, the bottom surface 126b, the top surface 144a, and the top surface 134a is removed, in accordance with some embodiments. The removal process includes performing an anisotropic etching process on the seal layer 160, in accordance with some embodiments. The anisotropic etching process includes a dry etching process, in accordance with some embodiments. The dry etching process includes a plasma etching process, in accordance with some embodiments.

After the removal process, the seal layer 160 has an opening 162 exposing the top surface 144a of the conductive structure 144, the top surface 134a of the barrier layer 134, and the dielectric layer 120 adjacent to the conductive structure 144, in accordance with some embodiments.

Figure 1E:
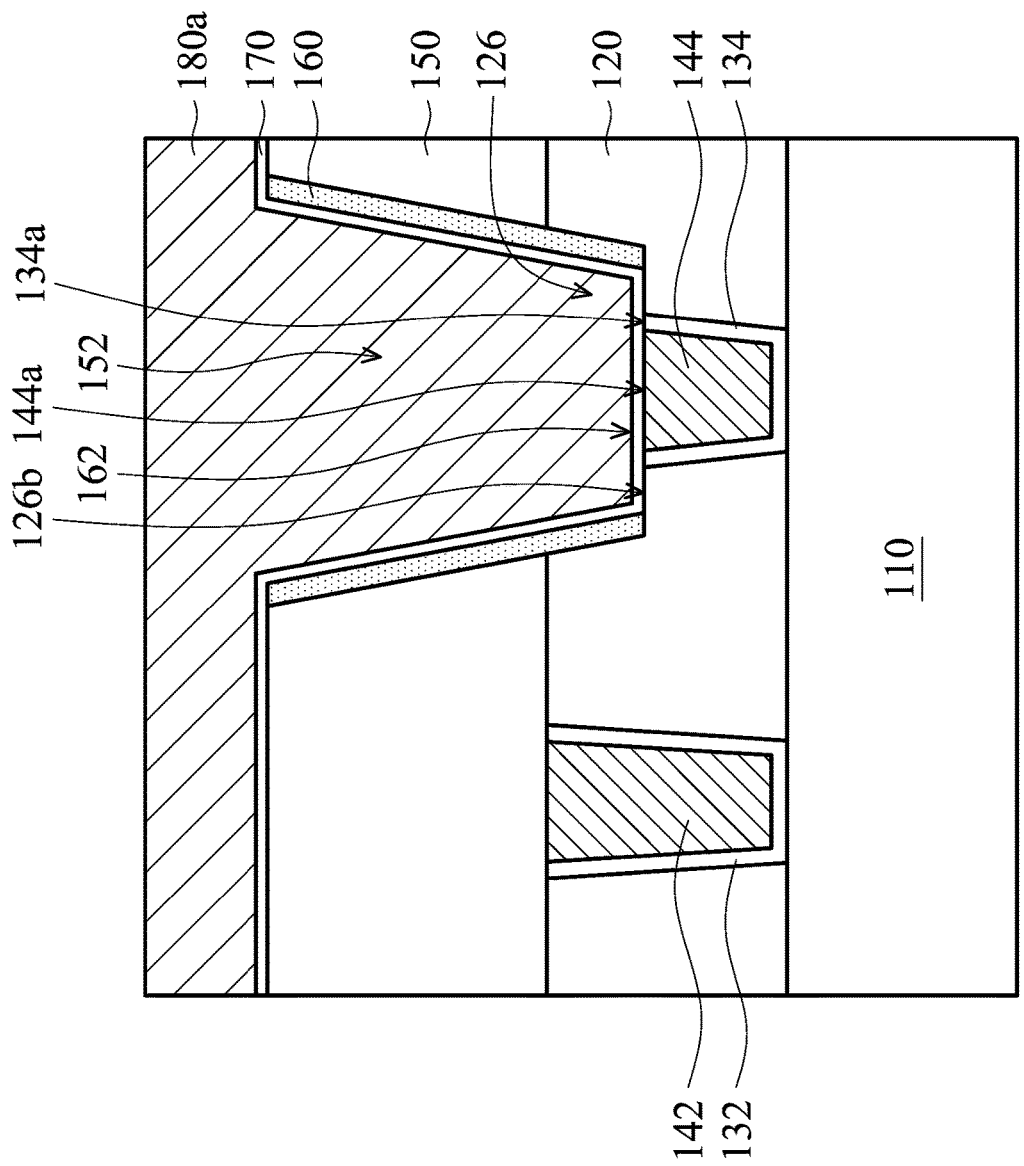

As shown in FIG. 1E, a barrier layer 170 is formed over the dielectric layer 150, the seal layer 160, the bottom surface 126b of the recess 126, the top surface 144a of the conductive structure 144, and the top surface 134a of the barrier layer 134, in accordance with some embodiments. The barrier layer 170 conformally covers the dielectric layer 150, the seal layer 160, the bottom surface 126b of the recess 126, the top surface 144a of the conductive structure 144, and the top surface 134a of the barrier layer 134, in accordance with some embodiments.

The barrier layer 170 is configured to prevent diffusion of metal materials formed in the opening 152 and the recess 126 into the dielectric layers 150 and 120, in accordance with some embodiments. The barrier layer 170 includes tantalum (Ta) and tantalum nitride (TaN), in accordance with some embodiments. The barrier layer 170 is formed using a physical vapor deposition (PVD) process, a chemical vapor deposition (CVD) process, or another suitable process.

As shown in FIG. 1E, a conductive material layer 180*a* is formed over the barrier layer 170 and filled into the opening 152 and the recess 126, in accordance with some embodiments. The conductive material layer 180*a* includes copper (Cu), tungsten (W), aluminum (Al), or another suitable material. The conductive material layer 180*a* is formed using a physical vapor deposition process, a plating process, or another suitable process.

Figure 1F:
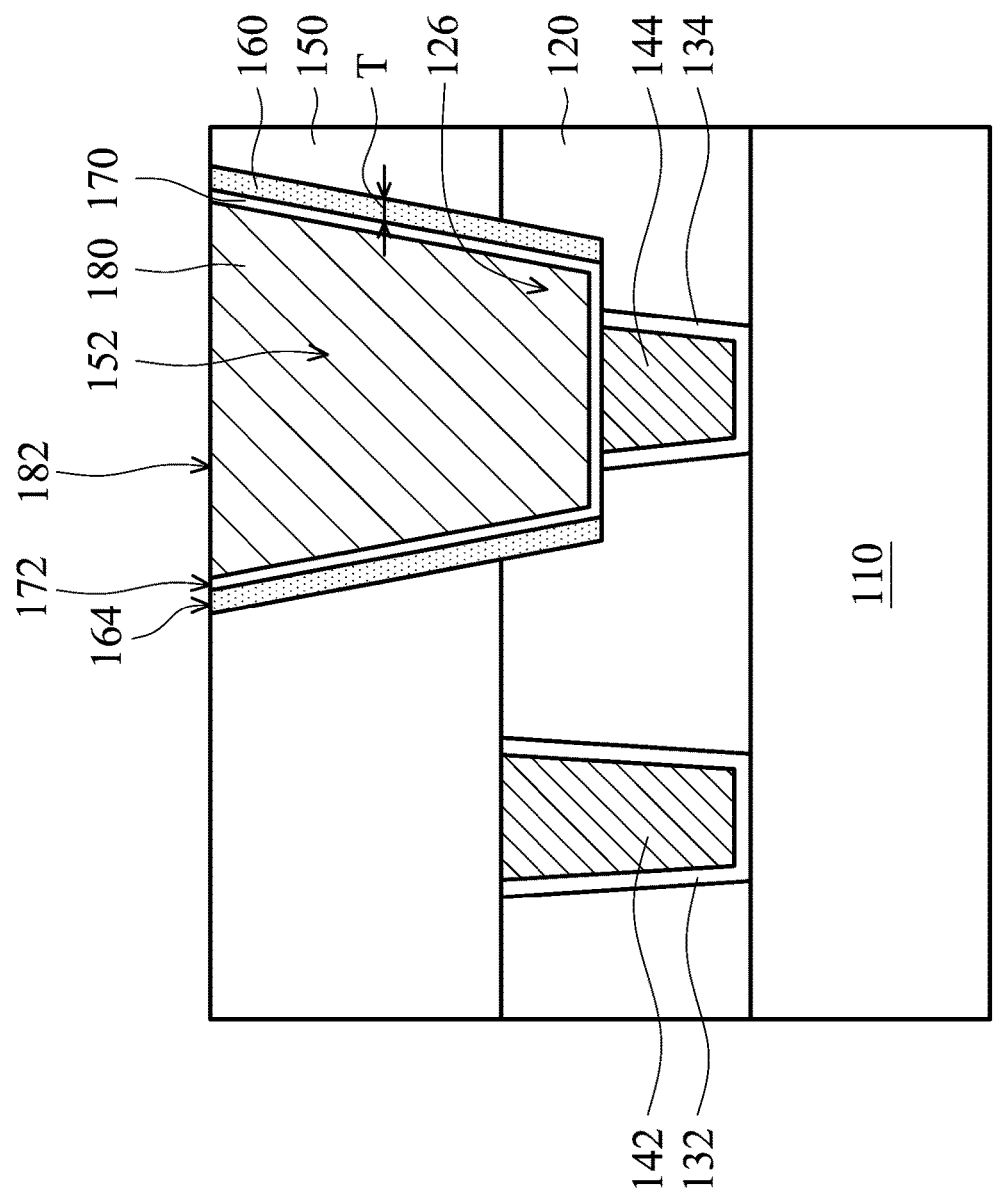

As shown in FIG. 1F, the barrier layer 170 and the conductive material layer 180*a* outside of the opening 152 and the recess 126 are removed, in accordance with some embodiments. The removal process includes a chemical mechanical polishing process, in accordance with some embodiments. The conductive material layer 180*a* remaining in the opening 152 and the recess 126 forms a conductive structure 180, in accordance with some embodiments.

The conductive structure 180 includes a conductive line, a conductive via, or another suitable interconnection structure, in accordance with some embodiments. In some embodiments, a top surface 164 of the seal layer 160, a top surface 172 of the barrier layer 170, and a top surface 182 of the conductive structure 180 are aligned with each other.

The conductive structure 180 is electrically connected to the conductive structure 144 through the barrier layer 170, in accordance with some embodiments. The conductive structure 180 is filled in the opening 152 and the recess 126, in accordance with some embodiments. The conductive structure 180 is surrounded by the seal layer 160, in accordance with some embodiments.

Since the seal layer 160 prevents by-products (e.g., polymers) from being formed on the dielectric layers 120 and 150, the conductive structure 144, and the barrier layer 134, the seal layer 160 improves the electrical connection between the conductive structure 144 and the conductive structure 180 (or the barrier layer 170). Therefore, the seal layer 160 improves the yield of the process, in accordance with some embodiments.

FIGS. 2A-2D are cross-sectional views of various stages of a process for forming a semiconductor device structure, in accordance with some embodiments. The process of FIGS. 2A-2D is similar to the process of FIGS. 1A-1F, except that the process of FIGS. 2A-2D forms a seal layer by performing a plasma etching and oxidation process, in accordance with some embodiments.

Figure 2A:
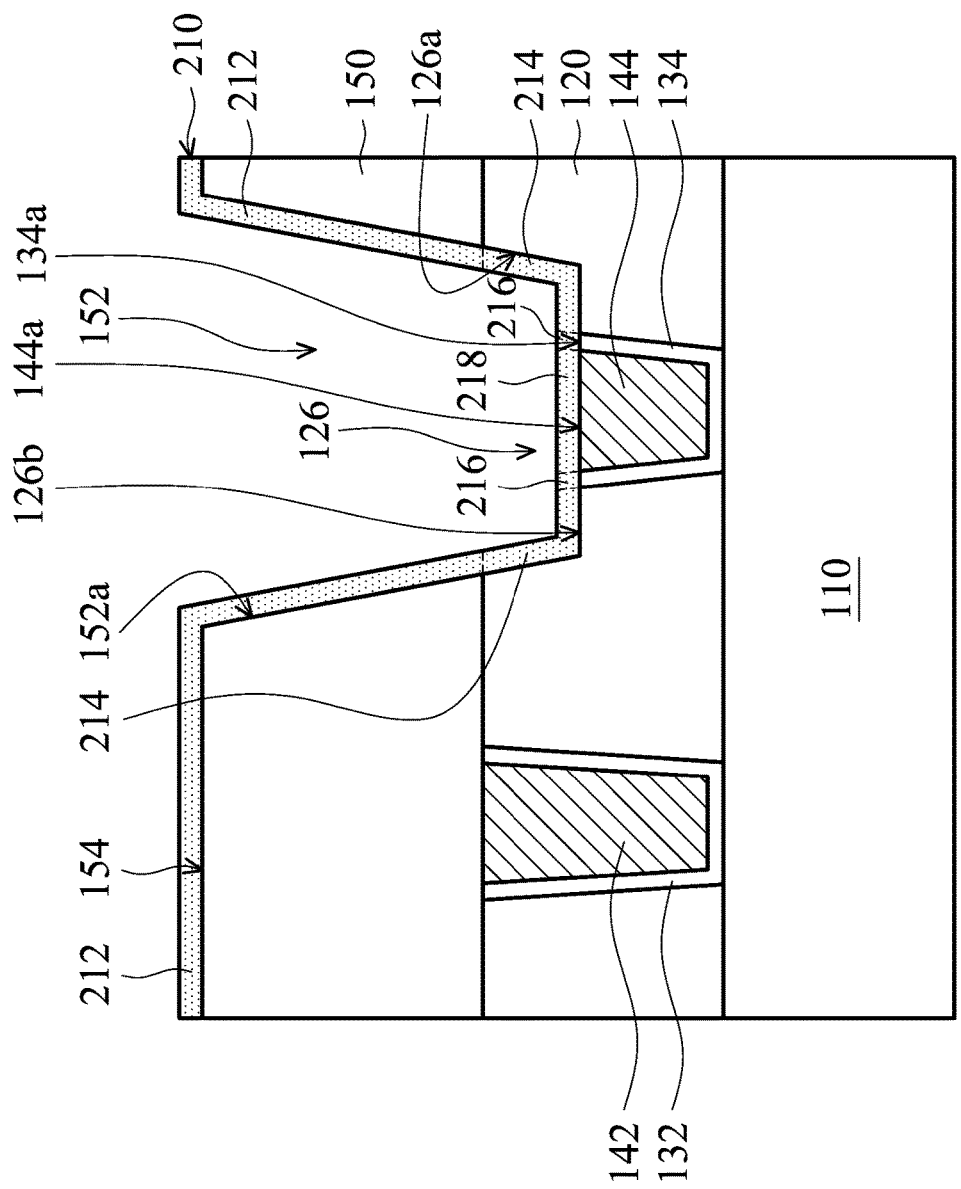
FIGS. 2A-2D are cross-sectional views of various stages of a process for forming a semiconductor device structure, in accordance with some embodiments.

After the step of FIG. 1B, as shown in FIG. 2A, a plasma etching and oxidation process is performed on the dielectric layers 120 and 150 to remove portions of the dielectric layers 120 and 150 and to form a seal layer 210 over the dielectric layers 120 and 150, the conductive structure 144, and the barrier layer 134, in accordance with some embodiments.

After the plasma etching and oxidation process, an opening 152 and a recess 126 are formed in the dielectric layers 150 and 120, respectively, in accordance with some embodiments. The opening 152 passes through the dielectric layer 150, in accordance with some embodiments. The opening 152 and the recess 126 expose the conductive structure 144, the barrier layer 134, and the dielectric layer 120 adjacent to the conductive structure 144, in accordance with some embodiments. The plasma etching and oxidation process further removes portions of the conductive structure 144 and the barrier layer 134, in accordance with some embodiments.

The seal layer 210 covers an inner wall 152*a* of the opening 152, an inner wall 126*a* and a bottom surface 126*b* of the recess 126, a top surface 144*a* of the conductive structure 144, a top surface 134*a* of the barrier layer 134, and a top surface 154 of the dielectric layer 150, in accordance with some embodiments. The seal layer 210 conformally covers the inner wall 152*a* of the opening 152, the inner wall 126*a* and the bottom surface 126*b* of the recess 126, the top surface 144*a* of the conductive structure 144, the top surface 134*a* of the barrier layer 134, and the top surface 154 of the dielectric layer 150, in accordance with some embodiments.

The seal layer 210 covers the entire inner wall 152*a* of the opening 152, the entire inner wall 126*a* and the entire bottom surface 126*b* of the recess 126, the entire top surface 144*a* of the conductive structure 144, the entire top surface 134*a* of the barrier layer 134, and the entire top surface 154 of the dielectric layer 150, in accordance with some embodiments.

The seal layer 210 continuously covers the entire inner wall 152*a* of the opening 152, the entire inner wall 126*a* and the entire bottom surface 126*b* of the recess 126, the entire top surface 144*a* of the conductive structure 144, the entire top surface 134*a* of the barrier layer 134, and the entire top surface 154 of the dielectric layer 150, in accordance with some embodiments. The seal layer 210 is a continuous layer, in accordance with some embodiments. The seal layer 210 is in direct contact with the dielectric layers 120 and 150, the conductive structure 144, and the barrier layer 134, in accordance with some embodiments.

The seal layer 210 includes dielectric materials including oxygen compounds, in accordance with some embodiments. The seal layer 210 is formed by oxidation of the dielectric layers 120 and 150, the conductive structure 144, and the barrier layer 134, in accordance with some embodiments. The seal layer 210 has portions 212, 214, 216, and 218, in accordance with some embodiments.

The portions 212, 214, 216, and 218 are formed on the dielectric layers 150 and 120, the barrier layer 134, and the conductive structure 144, respectively, in accordance with some embodiments. The portions 212, 214, 216, and 218 are formed by oxidation of the dielectric layers 150 and 120, the barrier layer 134, and the conductive structure 144, respectively, in accordance with some embodiments. Therefore, the portions 212, 214, 216, and 218 may be made of different materials.

The portion 212 includes an oxide of the material forming the dielectric layer 150, in accordance with some embodiments. For example, the dielectric layer 150 includes silicon, and the portion 212 includes silicon dioxide. The portion 214 includes an oxide of the material forming the dielectric layer 120, in accordance with some embodiments. For example, the dielectric layer 120 includes silicon, and the portion 214 includes silicon dioxide.

The portion 216 includes an oxide of the material forming the barrier layer 134, in accordance with some embodiments. The portion 216 includes tantalum oxide or another suitable material, in accordance with some embodiments. The portion 218 includes an oxide of the material forming the conductive structure 144, in accordance with some embodiments. The portion 218 includes copper oxide, tungsten trioxide, aluminum oxide, or another suitable material, in accordance with some embodiments.

The plasma etching and oxidation process uses a process gas, in accordance with some embodiments. The process gas includes an etching gas and an oxidation gas, in accordance with some embodiments. The etching gas is configured to remove the dielectric layers 150 and 120, in accordance with some embodiments. The etching gas includes $NF_3$, $CF_4$, or another suitable etching gas. The oxidation gas is configured to form the seal layer 210, in accordance with some embodiments. The oxidation gas includes oxygen, in accordance with some embodiments. The oxidation gas includes $O_2$, CO, or $CO_2$, in accordance with some embodiments.

During the plasma etching and oxidation process, the seal layer 210 is formed to cover the dielectric layers 120 and 150, the conductive structure 144, and the barrier layer 134, therefore the seal layer 210 prevents by-products (e.g., polymers) from being formed on the dielectric layers 120 and 150, the conductive structure 144, and the barrier layer 134, in accordance with some embodiments. As a result, the seal layer 210 prevents contamination of the dielectric layers 120 and 150, the conductive structure 144, and the barrier layer 134, in accordance with some embodiments. The seal layer 210 improves the yield of the process, in accordance with some embodiments.

Figure 2B:
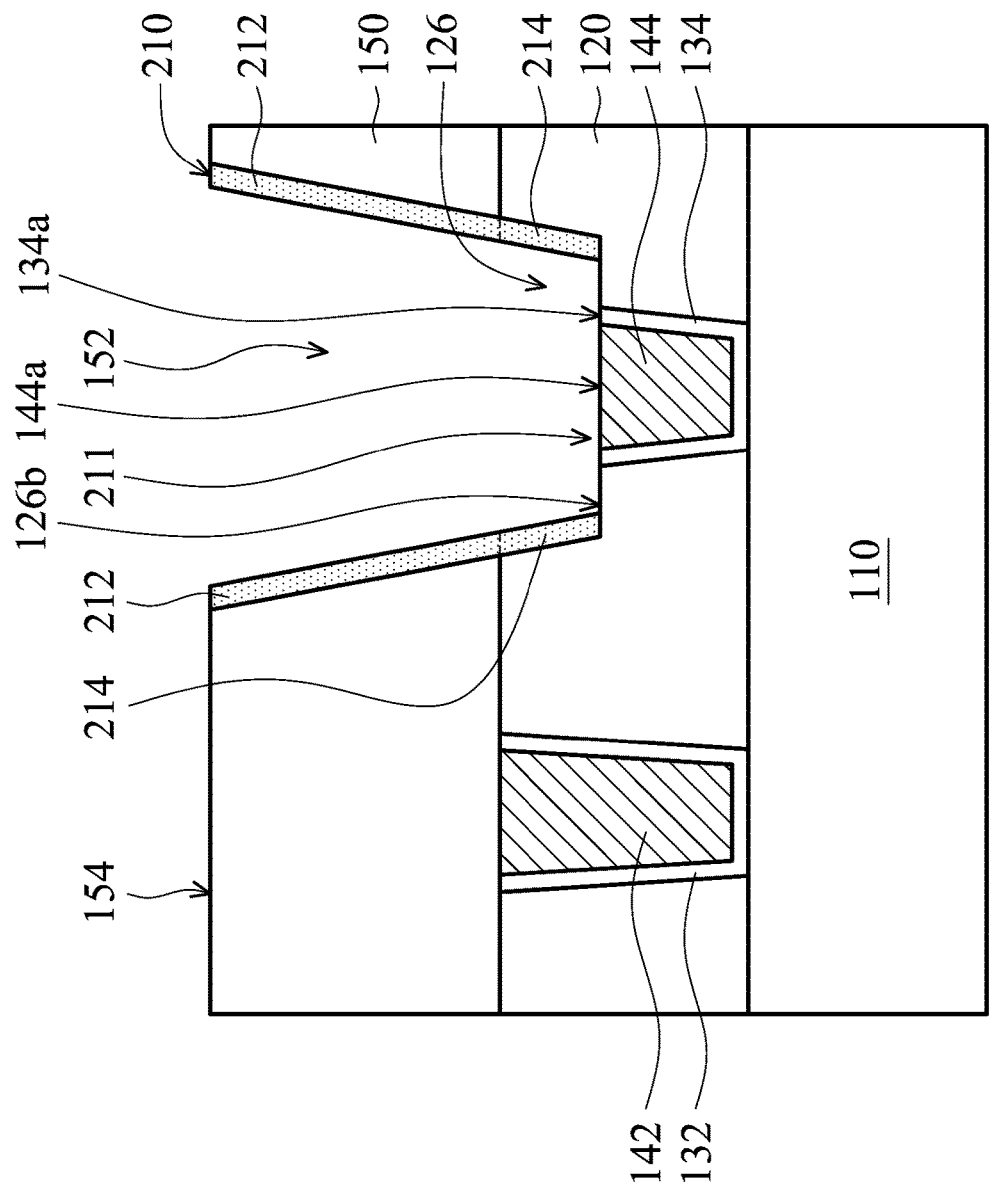

As shown in FIG. 2B, the seal layer 210 over the top surface 154, the bottom surface 126*b*, the top surface 144*a*, the top surface 134*a* is removed, in accordance with some embodiments. The removal process includes performing an anisotropic etching process on the seal layer 210, in accordance with some embodiments. The anisotropic etching process includes a dry etching process, in accordance with some embodiments.

The dry etching process includes a plasma etching process, in accordance with some embodiments. After the removal process, the seal layer 210 has an opening 211 exposing the top surface 144*a* of the conductive structure 144, the top surface 134*a* of the barrier layer 134, the dielectric layer 120 adjacent to the conductive structure 144, in accordance with some embodiments.

Figure 2C:
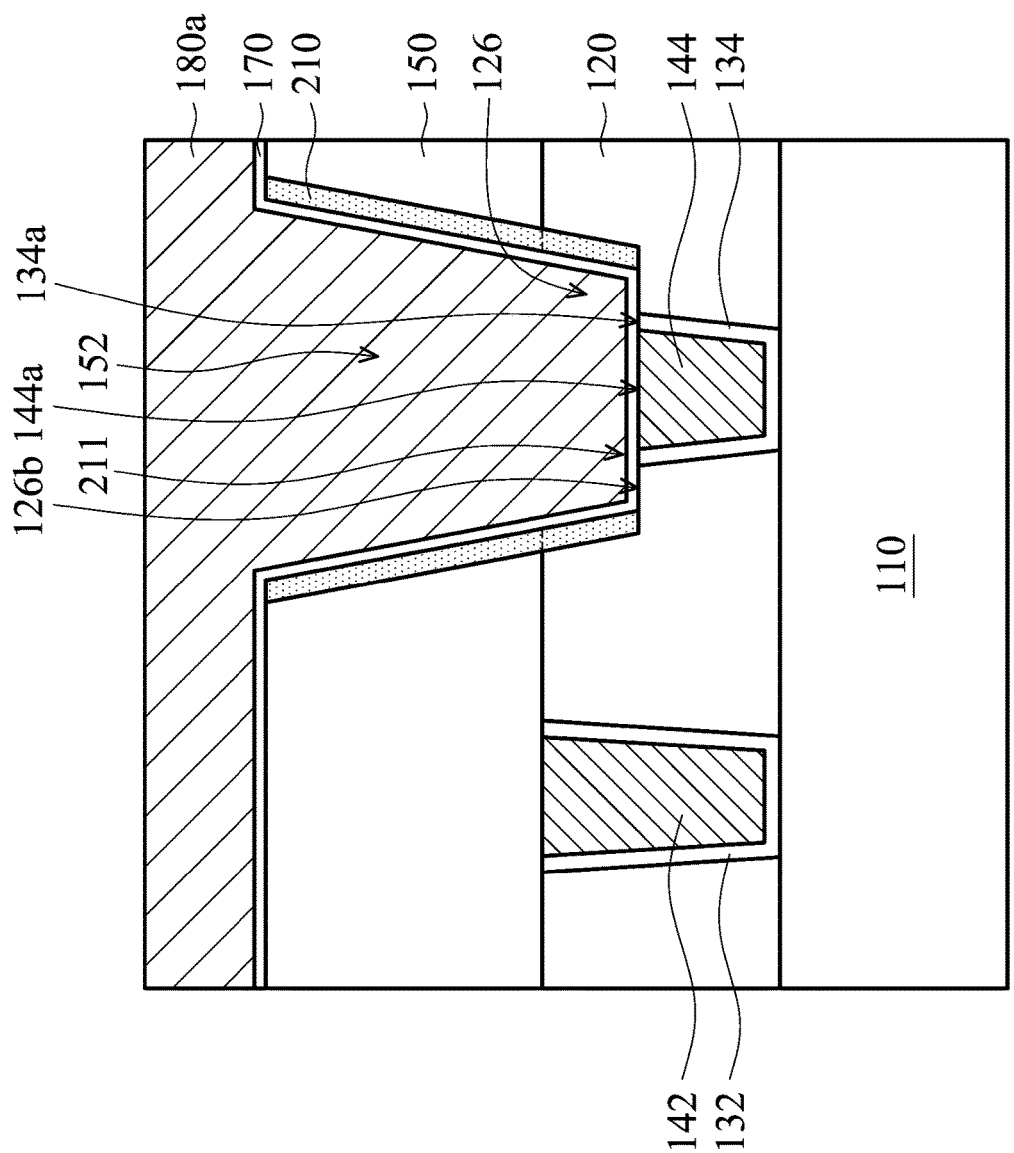

As shown in FIG. 2C, a barrier layer 170 is formed over the dielectric layer 150, the seal layer 210, the bottom surface 126*b* of the recess 126, the top surface 144*a* of the conductive structure 144, and the top surface 134*a* of the barrier layer 134, in accordance with some embodiments. The barrier layer 170 conformally covers the dielectric layer 150, the seal layer 210, the bottom surface 126*b* of the recess 126, the top surface 144*a* of the conductive structure 144, and the top surface 134*a* of the barrier layer 134, in accordance with some embodiments.

The barrier layer 170 is configured to prevent diffusion of metal materials formed in the opening 152 and the recess 126 into the dielectric layers 150 and 120, in accordance with some embodiments. The barrier layer 170 includes tantalum (Ta) and tantalum nitride (TaN), in accordance with some embodiments. The barrier layer 170 is formed using a physical vapor deposition (PVD) process, a chemical vapor deposition (CVD) process, or another suitable process.

As shown in FIG. 2C, a conductive material layer 180*a* is formed over the barrier layer 170 and filled into the opening 152 and the recess 126, in accordance with some embodiments. The conductive material layer 180*a* includes copper (Cu), tungsten (W), aluminum (Al), or another suitable material. The conductive material layer 180*a* is formed using a physical vapor deposition process, a plating process, or another suitable process.

Figure 2D:
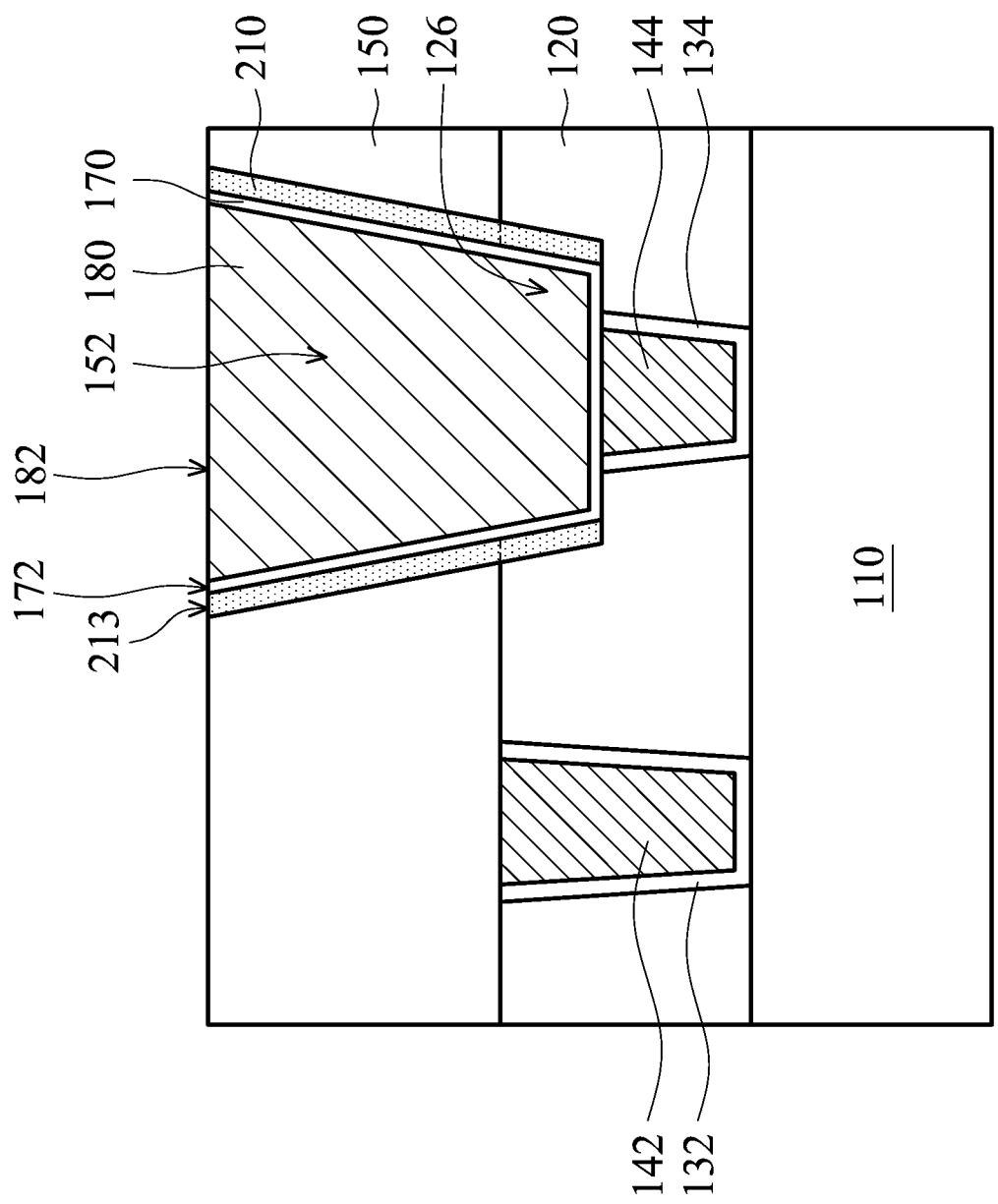

As shown in FIG. 2D, the barrier layer 170 and the conductive material layer 180*a* outside of the opening 152 and the recess 126 are removed, in accordance with some embodiments. The removal process includes a chemical mechanical polishing process, in accordance with some embodiments. The conductive material layer 180*a* remaining in the opening 152 and the recess 126 forms a conductive structure 180, in accordance with some embodiments. In some embodiments, a top surface 213 of the seal layer 210, a top surface 172 of the barrier layer 170, and a top surface 182 of the conductive structure 180 are aligned with each other.

The conductive structure 180 is electrically connected to the conductive structure 144 through the barrier layer 170, in accordance with some embodiments. The conductive structure 180 is filled in the opening 152 and the recess 126, in accordance with some embodiments. The conductive structure 180 is surrounded by the seal layer 210, in accordance with some embodiments.

Since the seal layer 210 prevents by-products (e.g., polymers) from being formed on the dielectric layers 120 and 150, the conductive structure 144, and the barrier layer 134, the seal layer 210 improves the electrical connection between the conductive structure 144 and the conductive structure 180 (or the barrier layer 170). Therefore, the seal layer 210 improves the yield of the process, in accordance with some embodiments.

FIGS. 3A-3E are cross-sectional views of various stages of a process for forming a semiconductor device structure, in accordance with some embodiments. The process of FIGS. 3A-3E is similar to the process of FIGS. 1A-1F, except that the process of FIGS. 3A-3E further includes a cleaning process performed between the formation of the opening of the dielectric layer and the formation of the seal layer.

Figure 3A:
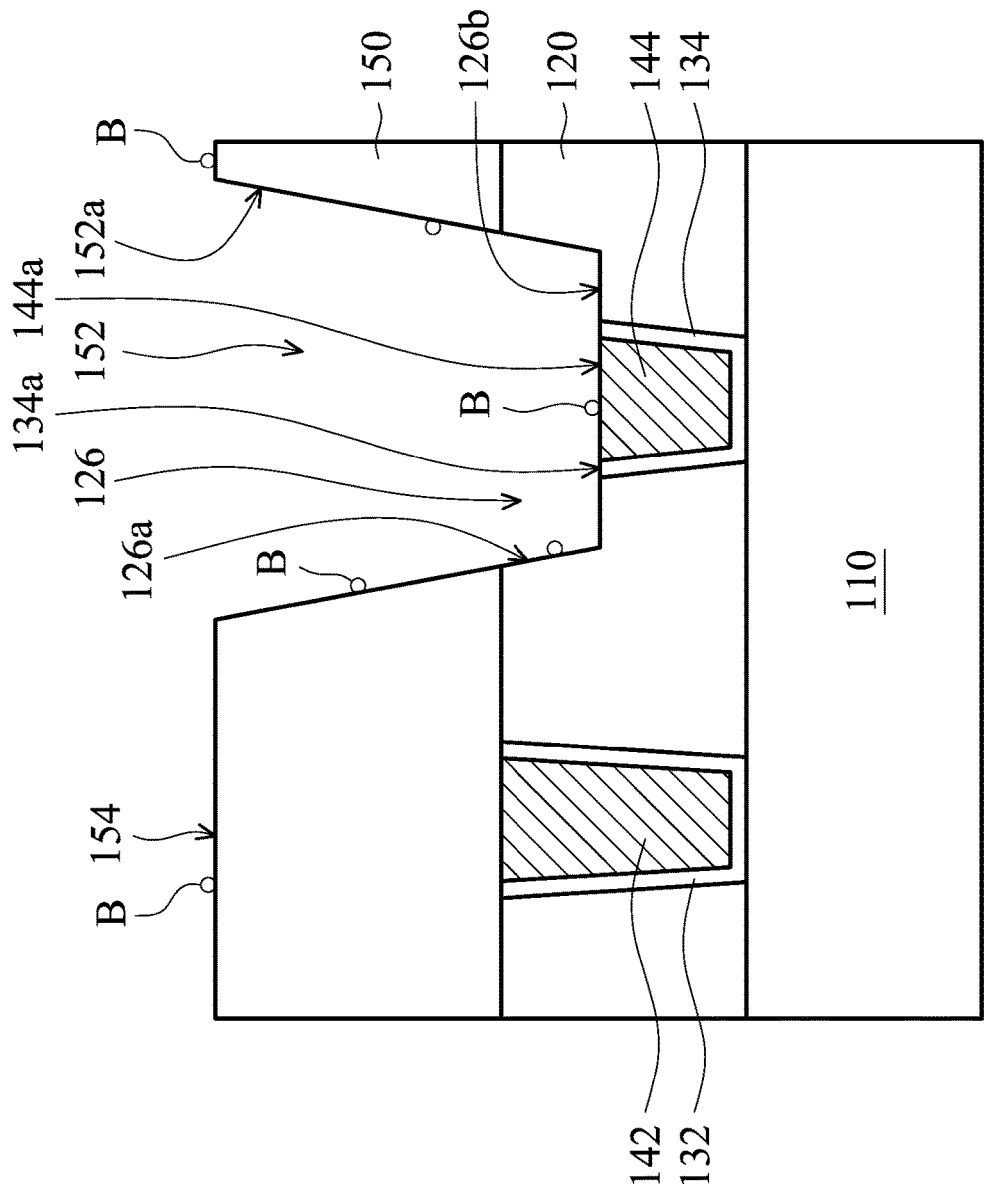
FIGS. 3A-3E are cross-sectional views of various stages of a process for forming a semiconductor device structure, in accordance with some embodiments.

After the step of FIG. 1B, as shown in FIG. 3A, a plasma etching process is performed on the dielectric layers 120 and 150 to remove portions of the dielectric layers 120 and 150, in accordance with some embodiments. After the plasma etching process, an opening 152 and a recess 126 are formed in the dielectric layers 150 and 120, respectively, in accordance with some embodiments.

The opening 152 passes through the dielectric layer 150, in accordance with some embodiments. The opening 152 and the recess 126 expose the conductive structure 144, the barrier layer 134, and the dielectric layer 120 adjacent to the conductive structure 144, in accordance with some embodiments. The plasma etching process further removes portions of the conductive structure 144 and the barrier layer 134, in accordance with some embodiments.

The plasma etching process may form by-products B over an inner wall 152*a* of the opening 152, an inner wall 126*a* and a bottom surface 126*b* of the recess 126, a top surface 144*a* of the conductive structure 144, a top surface 134*a* of the barrier layer 134, and a top surface 154 of the dielectric layer 150, in accordance with some embodiments.

Figure 3B:
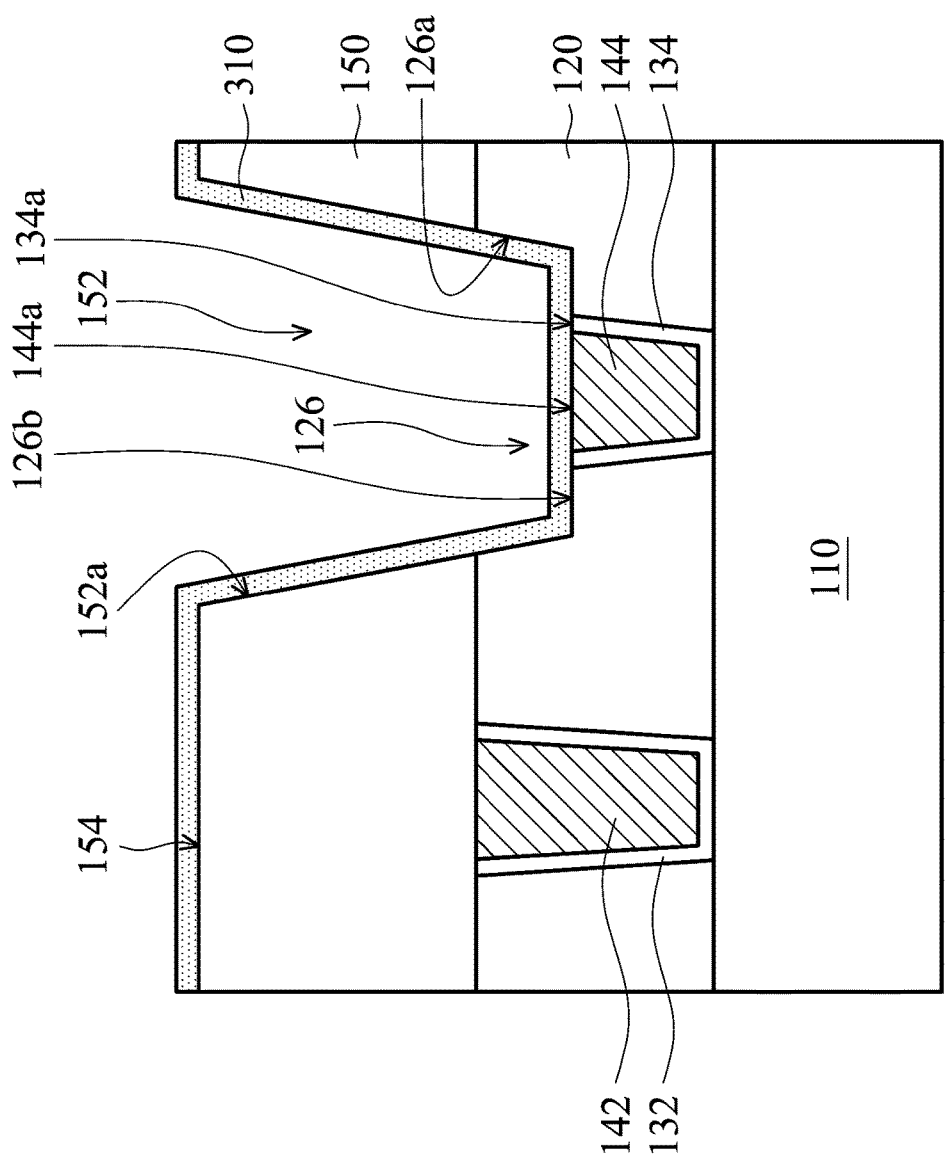

As shown in FIG. 3B, the by-products B are removed by performing a cleaning process, in accordance with some embodiments. The cleaning process includes a wet clean process, in accordance with some embodiments. As shown in FIG. 3B, a seal layer 310 is formed on the inner wall 152*a* of the opening 152, the inner wall 126*a* and the bottom surface 126*b* of the recess 126, the top surface 144*a* of the conductive structure 144, the top surface 134*a* of the barrier layer 134, and the top surface 154 of the dielectric layer 150, in accordance with some embodiments.

The seal layer 310 is formed by a plasma deposition process or a plasma oxidation process, in accordance with some embodiments. In some other embodiments, the seal layer 310 is formed by a chemical vapor deposition process. The materials of the seal layer 310 are similar to or the same as that of the seal layer 160 of FIG. 1F or the seal layer 210 of FIG. 2D, in accordance with some embodiments.

The seal layer 310 conformally covers the inner wall 152a of the opening 152, the inner wall 126a and the bottom surface 126b of the recess 126, the top surface 144a of the conductive structure 144, the top surface 134a of the barrier layer 134, and the top surface 154 of the dielectric layer 150, in accordance with some embodiments. The seal layer 310 is a continuous layer, in accordance with some embodiments. The seal layer 310 is in direct contact with the dielectric layers 120 and 150, the conductive structure 144, and the barrier layer 134, in accordance with some embodiments.

Since the seal layer 310 covers the dielectric layers 120 and 150, the conductive structure 144, and the barrier layer 134, the seal layer 310 prevents contamination of the dielectric layers 120 and 150, the conductive structure 144, and the barrier layer 134, in accordance with some embodiments. The seal layer 310 improves the yield of the process, in accordance with some embodiments.

Figure 3C:
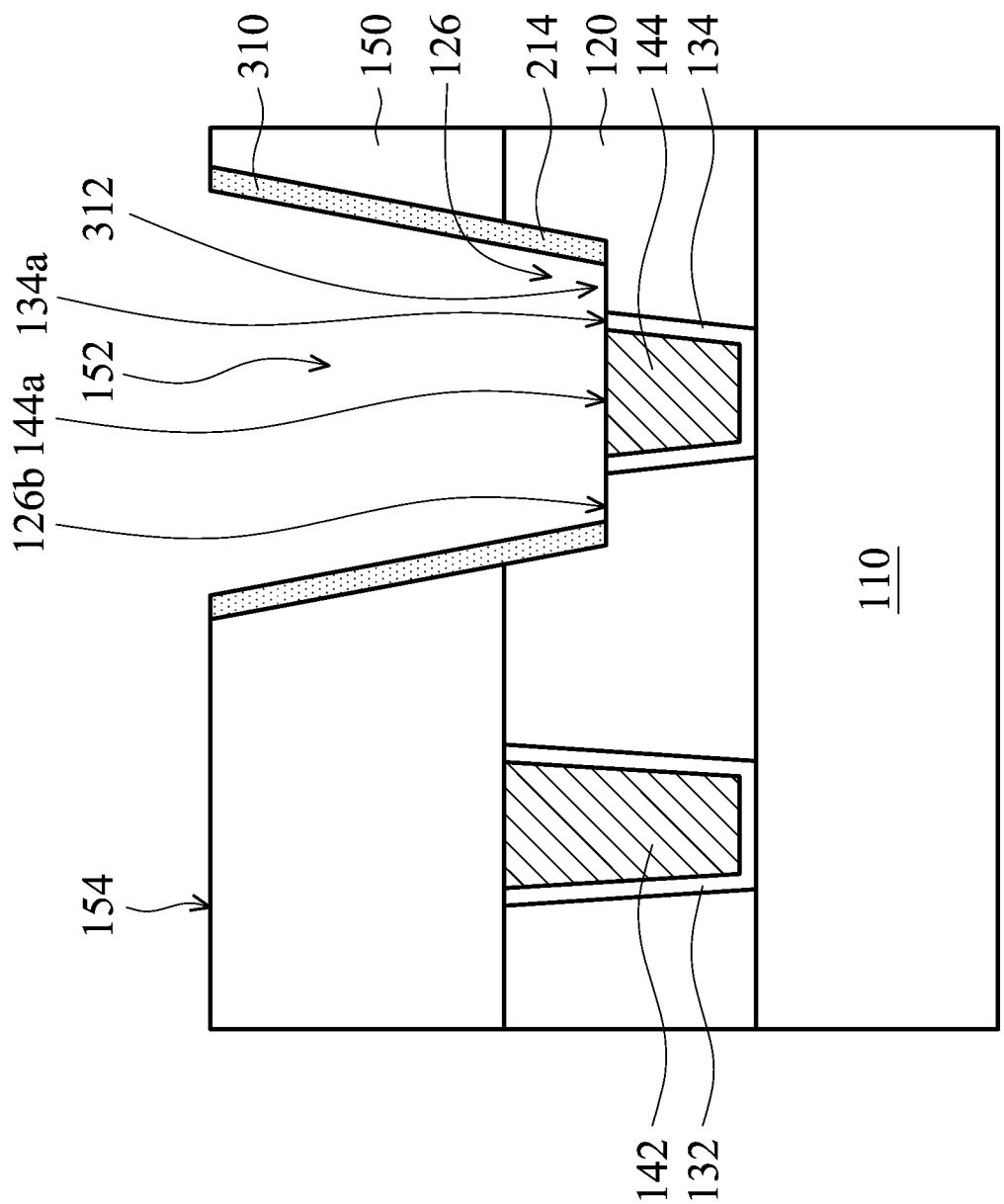

As shown in FIG. 3C, the seal layer 310 over the top surface 154, the bottom surface 126b, the top surface 144a, and the top surface 134a is removed, in accordance with some embodiments. The removal process includes performing an anisotropic etching process on the seal layer 310, in accordance with some embodiments. The anisotropic etching process includes a dry etching process, in accordance with some embodiments. The dry etching process includes a plasma etching process, in accordance with some embodiments.

After the removal process, the seal layer 310 has an opening 312 exposing the top surface 144a of the conductive structure 144, the top surface 134a of the barrier layer 134, the dielectric layer 120 adjacent to the conductive structure 144, in accordance with some embodiments.

Figure 3D:
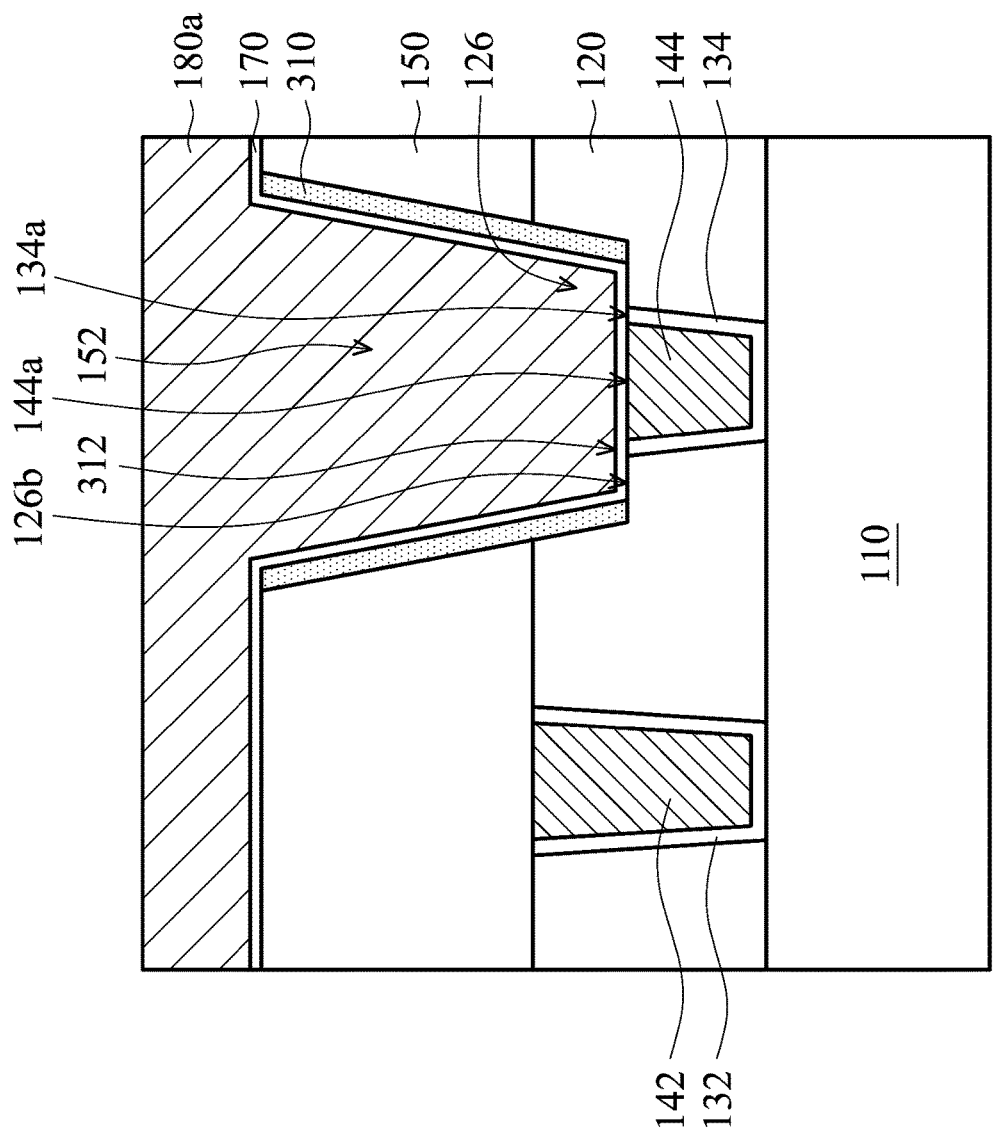

As shown in FIG. 3D, a barrier layer 170 is formed over the dielectric layer 150, the seal layer 310, the bottom surface 126b of the recess 126, the top surface 144a of the conductive structure 144, and the top surface 134a of the barrier layer 134, in accordance with some embodiments. The barrier layer 170 conformally covers the dielectric layer 150, the seal layer 310, the bottom surface 126b of the recess 126, the top surface 144a of the conductive structure 144, and the top surface 134a of the barrier layer 134, in accordance with some embodiments.

The barrier layer 170 is configured to prevent diffusion of metal materials formed in the opening 152 and the recess 126 into the dielectric layers 150 and 120, in accordance with some embodiments. The barrier layer 170 includes tantalum (Ta) and tantalum nitride (TaN), in accordance with some embodiments. The barrier layer 170 is formed using a physical vapor deposition (PVD) process, a chemical vapor deposition (CVD) process, or another suitable process.

As shown in FIG. 3D, a conductive material layer 180a is formed over the barrier layer 170 and filled into the opening 152 and the recess 126, in accordance with some embodiments. The conductive material layer 180a includes copper (Cu), tungsten (W), aluminum (Al), or another suitable material. The conductive material layer 180a is formed using a physical vapor deposition process, a plating process, or another suitable process.

Figure 3E:
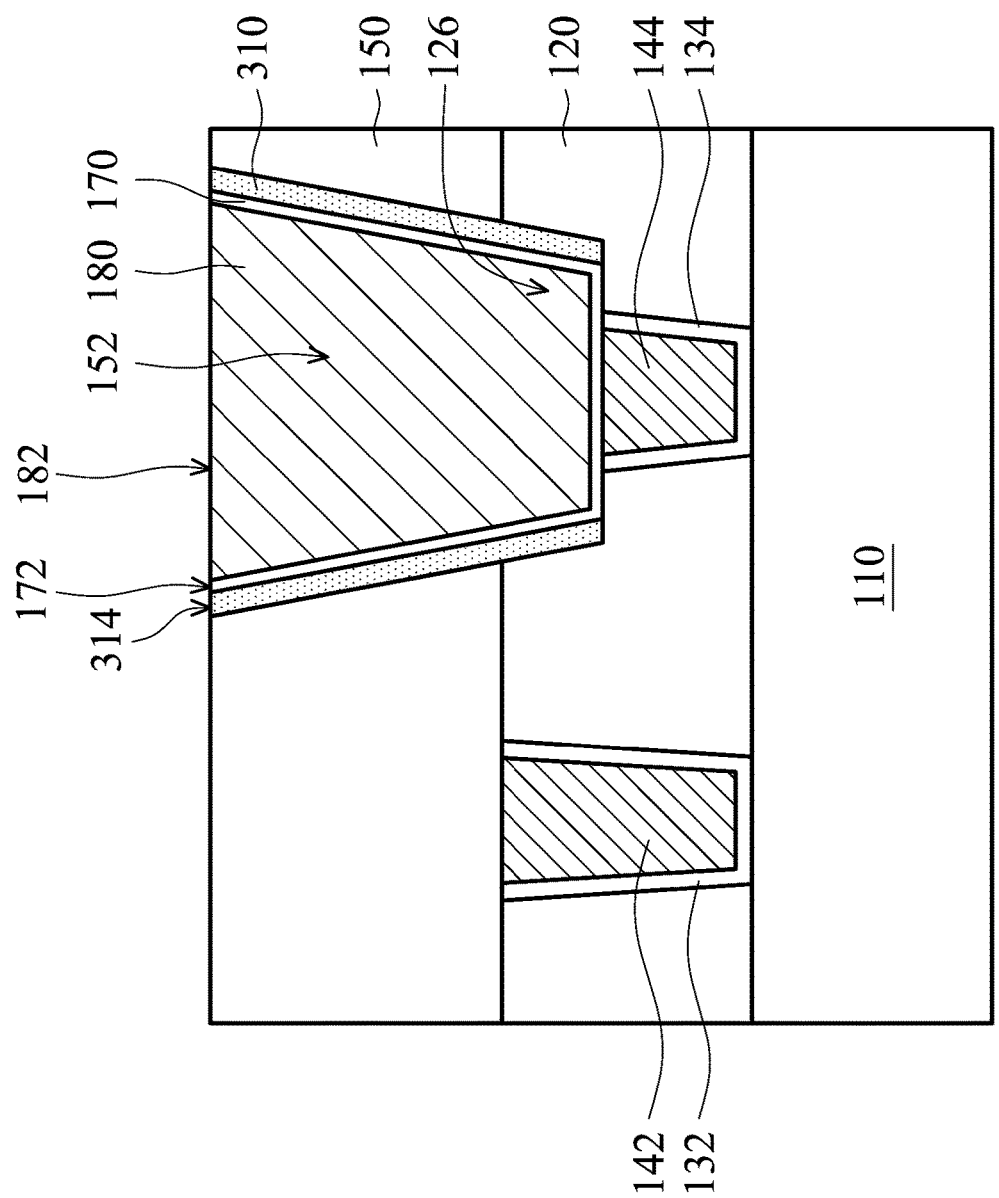

As shown in FIG. 3E, the barrier layer 170 and the conductive material layer 180a outside of the opening 152 and the recess 126 are removed, in accordance with some embodiments. The removal process includes a chemical mechanical polishing process, in accordance with some embodiments.

The conductive material layer 180a remaining in the opening 152 and the recess 126 forms a conductive structure 180, in accordance with some embodiments. In some embodiments, a top surface 314 of the seal layer 310, a top surface 172 of the barrier layer 170, and a top surface 182 of the conductive structure 180 are aligned with each other.

The conductive structure 180 is electrically connected to the conductive structure 144 through the barrier layer 170, in accordance with some embodiments. The conductive structure 180 is filled in the opening 152 and the recess 126, in accordance with some embodiments. The conductive structure 180 is surrounded by the seal layer 310, in accordance with some embodiments.

In accordance with some embodiments, semiconductor device structures and methods for forming the same are provided. The methods (for forming the semiconductor device structure) form a seal layer to cover an opening of a dielectric layer so as to prevent by-products (e.g., polymers) from being formed in the opening. Therefore, the seal layer prevents contamination of the opening. As a result, the seal layer improves the electrical connection between a first conductive structure formed in the opening and a second conductive structure under the opening. The seal layer improves the yield of the process.

In accordance with some embodiments, a semiconductor device structure is provided. The semiconductor device structure includes a substrate. The semiconductor device structure includes a first conductive structure over the substrate. The semiconductor device structure includes a first dielectric layer over the substrate. The first dielectric layer has a first opening exposing the first conductive structure. The semiconductor device structure includes a seal layer covering an inner wall of the first opening and in direct contact with the first dielectric layer. The seal layer includes a dielectric material including an oxygen compound. The semiconductor device structure includes a second conductive structure filled in the first opening and surrounded by the seal layer. The second conductive structure is electrically connected to the first conductive structure.

In accordance with some embodiments, a semiconductor device structure is provided. The semiconductor device structure includes a substrate. The semiconductor device structure includes a first conductive structure over the substrate. The semiconductor device structure includes a first dielectric layer over the substrate. The first dielectric layer has an opening exposing the first conductive structure, and the first dielectric layer includes a first element. The semiconductor device structure includes a seal layer covering a first inner wall of the opening and in direct contact with the first dielectric layer. The seal layer includes a first oxygen compound of the first element. The semiconductor device structure includes a second conductive structure filled in the opening and surrounded by the seal layer. The second conductive structure is electrically connected to the first conductive structure.

In accordance with some embodiments, a method for forming a semiconductor device structure is provided. The method includes forming a first conductive structure over a substrate. The method includes forming a dielectric layer over the substrate. The dielectric layer has an opening exposing the first conductive structure. The method includes forming a seal layer over an inner wall of the opening. The seal layer is in direct contact with the dielectric layer, and the seal layer includes a dielectric material including an oxygen compound. The method includes filling a second conductive structure into the opening. The second conductive structure is surrounded by the seal layer, and the second conductive structure is electrically connected to the first conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a substrate;
    a first conductive structure over the substrate;
    a first dielectric layer over the substrate, wherein the first dielectric layer has a first opening exposing the first conductive structure;
    a second dielectric layer between the first dielectric layer and the substrate;
    a seal layer covering an inner wall of the first opening and in direct contact with the first dielectric layer, wherein the seal layer comprises a dielectric material comprising an oxygen compound, and the seal layer extends into the second dielectric layer; and
    a second conductive structure filled in the first opening and surrounded by the seal layer, wherein the second conductive structure is electrically connected to the first conductive structure.

2. The semiconductor device structure as claimed in claim 1, wherein the seal layer is a continuous layer.

3. The semiconductor device structure as claimed in claim 1, wherein the seal layer continuously covers the entire inner wall.

4. The semiconductor device structure as claimed in claim 1, wherein the seal layer has a second opening exposing the first conductive structure.

5. The semiconductor device structure as claimed in claim 4,
    wherein the first conductive structure is embedded in the second dielectric layer, and the second opening further exposes the second dielectric layer adjacent to the first conductive structure.

6. The semiconductor device structure as claimed in claim 5, wherein the seal layer is in direct contact with the second dielectric layer.

7. The semiconductor device structure as claimed in claim 1, wherein the seal layer conformally covers the inner wall of the first opening.

8. The semiconductor device structure as claimed in claim 1, wherein a first top surface of the second conductive structure and a second top surface of the seal layer are aligned with each other.

9. A semiconductor device structure, comprising:
    a substrate;
    a first conductive structure over the substrate;
    a first dielectric layer over the substrate, wherein the first dielectric layer has an opening exposing the first conductive structure, and the first dielectric layer comprises a first material;
    a second dielectric layer between the first dielectric layer and the substrate;
    a seal layer covering a first inner wall of the opening and in direct contact with the first dielectric layer, wherein the seal layer comprises a first oxygen compound of the first material, and a bottom of the seal layer is between a top surface of the second dielectric layer and the substrate; and
    a second conductive structure filled in the opening and surrounded by the seal layer, wherein the second conductive structure is electrically connected to the first conductive structure.

10. The semiconductor device structure as claimed in claim 9, wherein the first material comprises silicon, and the first oxygen compound of the first material comprises silicon dioxide.

11. The semiconductor device structure as claimed in claim 9, wherein the seal layer is a continuous layer.

12. The semiconductor device structure as claimed in claim 9, further comprising:
    a barrier layer between the seal layer and the second conductive structure and between the first conductive structure and the second conductive structure.

13. The semiconductor device structure as claimed in claim 9,
    wherein the first conductive structure is embedded in the second dielectric layer, the second dielectric layer has a recess under the opening, the seal layer further covers a second inner wall of the recess, the second dielectric layer comprises a second material, and the seal layer covering the second inner wall comprises a second oxygen compound of the second material.

14. The semiconductor device structure as claimed in claim 13, wherein the seal layer covering the second inner wall is in direct contact with the second dielectric layer.

15. The semiconductor device structure as claimed in claim 13, wherein the seal layer continuously covers the entire first inner wall and the entire second inner wall.

16. A semiconductor device structure, comprising:
    a substrate;
    a first conductive structure over the substrate;
    a first dielectric layer over the substrate, wherein the first dielectric layer has a first opening exposing the first conductive structure;
    a second dielectric layer between the first dielectric layer and the substrate;
    a seal layer covering an inner wall of the first opening and in direct contact with the first dielectric layer, wherein the seal layer comprises a dielectric material comprising an oxygen compound, and the seal layer is in direct contact with the second dielectric layer;
    a barrier layer over the seal layer and a top surface of the first conductive structure; and
    a second conductive structure filled in the first opening and over the barrier layer, wherein the second conductive structure is electrically connected to the first conductive structure.

17. The semiconductor device structure as claimed in claim 16, wherein the barrier layer conformally covers the seal layer and the top surface of the first conductive structure.

18. The semiconductor device structure as claimed in claim 16, wherein the barrier layer comprises tantalum and tantalum nitride.

19. The semiconductor device structure as claimed in claim 16, wherein the barrier layer is in direct contact with the seal layer.

20. The semiconductor device structure as claimed in claim 16, wherein the seal layer continuously covers the entire inner wall.

* * * * *